(12) United States Patent
Saggio et al.

(10) Patent No.: US 8,828,809 B2
(45) Date of Patent: Sep. 9, 2014

(54) MULTI-DRAIN SEMICONDUCTOR POWER DEVICE AND EDGE-TERMINATION STRUCTURE THEREOF

(71) Applicant: STMicroelectronics S.r.l., Agrate Brianza (IT)

(72) Inventors: Mario Giuseppe Saggio, Aci Castello (IT); Alfio Guarnera, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 13/887,066

(22) Filed: May 3, 2013

(65) Prior Publication Data

US 2013/0244397 A1 Sep. 19, 2013

Related U.S. Application Data

(62) Division of application No. 12/640,980, filed on Dec. 17, 2009, now Pat. No. 8,455,956.

(30) Foreign Application Priority Data

Dec. 29, 2008 (IT) .............................. TO2008A0999

(51) Int. Cl.
| | |
|---|---|
| *H01L 21/332* | (2006.01) |
| *H01L 21/761* | (2006.01) |
| *H01L 29/78* | (2006.01) |
| *H01L 29/06* | (2006.01) |

(52) U.S. Cl.
CPC ............ *H01L 21/761* (2013.01); *H01L 29/0696* (2013.01); *H01L 29/0638* (2013.01); *H01L 29/7811* (2013.01); *H01L 29/0634* (2013.01)
USPC .................... 438/140; 438/174; 257/E21.427

(58) Field of Classification Search
USPC ......... 438/140, 174, 181, 185, 197, 222, 224; 257/E21.427
See application file for complete search history.

(56) References Cited

U.S. PATENT DOCUMENTS

| | | | |
|---|---|---|---|
| 6,228,719 | B1 | 5/2001 | Frisina et al. |
| 6,300,171 | B1 | 10/2001 | Frisina |
| 6,404,010 | B2 | 6/2002 | Saggio et al. |
| 6,586,798 | B1 | 7/2003 | Frisina |

(Continued)

FOREIGN PATENT DOCUMENTS

| | | |
|---|---|---|
| EP | 1911075 A1 | 1/2008 |
| WO | WO 2007/006503 A1 | 1/2007 |
| WO | WO 2007/116420 A1 | 10/2007 |
| WO | WO 2007/122646 A1 | 11/2007 |

OTHER PUBLICATIONS

Italian Search Report and Written Opinion dated Aug. 14, 2009 from corresponding Italian Application No. TO20080999.

*Primary Examiner* — Hoai V Pham
(74) *Attorney, Agent, or Firm* — Wolf, Greenfield & Sacks, P.C.

(57) ABSTRACT

An embodiment of a semiconductor power device provided with: a structural body made of semiconductor material with a first conductivity, having an active area housing one or more elementary electronic components and an edge area delimiting externally the active area; and charge-balance structures, constituted by regions doped with a second conductivity opposite to the first conductivity, extending through the structural body both in the active area and in the edge area in order to create a substantial charge balance. The charge-balance structures are columnar walls extending in strips parallel to one another, without any mutual intersections, in the active area and in the edge area.

28 Claims, 11 Drawing Sheets

(56) References Cited

U.S. PATENT DOCUMENTS

| | | |
|---|---|---|
| 7,498,619 B2 | 3/2009 | Saggio et al. |
| 2001/0028083 A1 | 10/2001 | Onishi et al. |
| 2003/0222327 A1 | 12/2003 | Yamaguchi et al. |
| 2004/0113200 A1 | 6/2004 | Kobayashi et al. |
| 2005/0184336 A1 | 8/2005 | Takahashi et al. |
| 2007/0228490 A1 | 10/2007 | Kocon |
| 2008/0224204 A1 | 9/2008 | Saggio et al. |
| 2009/0001460 A1 | 1/2009 | Saggio et al. |

MULTI-DRAIN SEMICONDUCTOR POWER DEVICE AND EDGE-TERMINATION STRUCTURE THEREOF

PRIORITY CLAIM

This application claims the priority benefit of U.S. patent application Ser. No. 12/640,980, filed on Dec. 17, 2009, which application claims priority to Italian Patent Application No. TO2008A000999, filed Dec. 29, 2008, which applications are hereby incorporated by reference to the maximum extent allowable by law.

BACKGROUND

1. Technical Field

An embodiment of the present invention relates to a semiconductor power device of a multi-drain type and to a corresponding edge-termination structure.

2. Discussion of the Related Art

In the last few years, a wide range of solutions have been developed for improving the efficiency of semiconductor power devices, and in particular for obtaining an increase of the breakdown voltage and a decrease of the output resistance.

For example, U.S. Pat. Nos. 6,228,719, 6,300,171, 6,404,010, and 6,586,798, which are incorporated by reference, describe vertical-conduction semiconductor power devices of the multi-drain (MD) type, wherein, within an epitaxial layer forming part of a drain region having a given type of conductivity, charge-balance columnar structures are provided, having opposite conductivity. These structures have a dopant concentration substantially equal and opposite to the dopant concentration of the epitaxial layer in such a way as to provide a substantial charge balance. Charge balance enables high breakdown voltages to be obtained, and moreover the high concentration that the epitaxial layer can consequently assume enables a low output resistance (and reduced losses in conduction) to be achieved.

In order to manufacture the columnar structures, a sequence of steps of growth of epitaxial layers of a first conductivity, for example of an N type, is envisaged, each step being followed by an implantation of dopant of the second conductivity, in the example of a P type. The implanted regions are stacked and subjected to a subsequent process of diffusion of the dopant atoms so as to give rise to uniform columnar structures.

Next, body regions of the power device are formed in contact with the columnar structures, in the active region, in such a way that the columnar structures constitute an extension of the body regions within the drain region.

The evolution of this technology has shown a progressive increase in the density of the elementary strips forming the devices in order to increase further the charge concentration of the epitaxial layer and obtain devices that, given the same breakdown voltage (substantially linked to the height of the columnar structures), would present a lower output resistance. On the other hand, however, the increase in the density of the elementary strips has led to a reduction of the thermal budget of the devices and a corresponding increase in the number of steps of epitaxial growth, and hence an increase in the manufacturing costs and time and in the defectiveness intrinsically linked to the epitaxial growth.

Alternative techniques have hence been developed in order to obtain the charge-balance structures, which envisage, for example, formation of trenches within the epitaxial layer and subsequent filling of the same trenches with semiconductor material appropriately doped to achieve the charge balance. For example, in patent applications WO 2007/116420 and WO 2007/122646, which are incorporated by reference, techniques are described for obtaining charge-balance structures in electronic power devices, which envisage the formation of trenches and filling thereof without any residual defectiveness via a particular technique of non-selective epitaxial growth performed in the same trenches.

t is also known that the formation of efficient edge-termination structures may be a key point for ensuring proper operation of the power devices. In fact, it is at the edge areas (i.e., the areas surrounding the active area in which the electronic components are provided) that the highest number of breakdown phenomena occurs on account of the thickening of the electric field lines due to the presence of discontinuities, such as sharp edges or the curvature of the doped regions. Edge terminations have the function of reducing the intensity of the electric field locally so as to prevent peaks of intensity at the edges.

FIGS. 1-4 (which are not drawn to scale, as the subsequent figures are also not to scale) show an example of an edge-termination structure of a known type, for a vertical-conduction charge-balance power device. In particular, FIG. 1 shows a schematic and simplified top plan view, whilst FIGS. 2, 3 and 4 show cross sections taken along lines II-II, III-III and IV-IV indicated in FIG. 1, respectively.

The power device, designated by 1, is formed in a die 2 of semiconductor material, for example silicon. The die 2 has, in top plan view, a generically rectangular or square shape; the borders and edges of the die 2 correspond to the so-called "scribe lines" (designated by LT), at which the starting wafer of semiconductor material has been cut. In the die 2 it is possible to define a peripheral portion 2a, adjacent to the scribe lines, and a central portion 2b, in which the power device 1 is physically provided.

The die 2 comprises a substrate 3 having a first type of conductivity, for example of an $N^{++}$ type, and an epitaxial layer 4, formed on the substrate 3, also having the first type of conductivity, in the example of an N type. Within the epitaxial layer 4 it is possible to distinguish an active area 4a, designed to house elementary electronic components 50 (in the example, MOS transistors) of the power device 1, and an edge area 4b, designed to house an edge-termination structure of the device and adjoining the peripheral portion 2a of the die 2. In particular, the epitaxial layer 4 constitutes a common drain surface region for the plurality of elementary electronic components 50 (the MOS transistors) forming the power device 1.

The edge-termination structure comprises a ring region 5, in particular a region doped with a second type of conductivity, of a P type, with low concentration, for example, lower than $10^{16}$ at/cm$^3$, formed in a surface portion of the epitaxial layer 4. The ring region 5 is provided within the edge area 4b, surrounds the active area 4a completely (forming a ring around it), and has an area of superposition with a peripheral portion of the same active area 4a. In particular, the ring region 5 has a rounded-off and curved profile in such a way as to reduce local concentrations of the field lines.

Charge-balance structures 7 (which have in cross section a column conformation, see in particular FIGS. 2-4) traverse the epitaxial layer 4 substantially throughout its thickness, stopping at a certain distance from the substrate 3, both at the active area 4a and at the ring region 5 in the edge area 4b. The charge-balance structures 7 are, for example, obtained through successive steps of epitaxial growth and implantation of dopant atoms in order to obtain stacked doped regions, and through a final step of diffusion of the dopant atoms.

The charge-balance structures 7 follow the layout of the regions in which they are formed, and are constituted by doped regions having the second type of conductivity (P) and a doping level such as to create a substantial charge balance. In particular, in the active area 4a the charge-balance structures 7 are constituted (in plan view, see FIG. 1) by first strips 7a, having a substantially rectilinear extension, parallel to one another and to a first side of the die 2 (and to a first axis x), which repeat periodically and at substantially the same distance in a direction parallel to a second side of the die 2 (and to a second axis y, orthogonal to the first axis x). Instead, in the edge area 4b the charge-balance structures 7 follow the pattern and the profile of the ring region 5, within which they are housed, and are made up of second strips 7b, once again parallel to and set at substantially the same distance from one another, each of which is constituted by: a first rectilinear portion parallel to the first side of the die 2 (and to the first axis x); a second rectilinear portion parallel to the second side of the die 2 (and to the second axis y); and a curved connecting portion between the first rectilinear portion and the second rectilinear portion (in particular having substantially the same radius of curvature as the ring region 5).

In particular, given their columnar extension in the thickness of the epitaxial layer 4, the charge-balance structures 7 constitute vertical walls or diaphragms extending in strips within the same epitaxial layer 4. In addition, in current design rules, the number of the second strips 7b that occupy the ring region 5 is determined by the dimension of the ring and by the pitch (in terms of spacing and size) of the first strips 7a in the active area 4a.

Body wells 9 are present within the active area 4a, having the second type of conductivity (P) and contacting each first strip 7a of the charge-balance structures 7, at the surface portion of the epitaxial layer 4. In particular, the first strips 7a constitute extensions of the body wells 9 within the drain region in the epitaxial layer 4. Source regions 10, having the first type of conductivity (N), are provided inside each body well 9. In particular, in the area of superposition between the active area 4a and the ring region 5, the outermost body wells 9 join the same ring region 5. In addition, in the edge area 4b, the second strips 7b of the charge-balance structures 7 are joined to one another by the ring region 5.

The power device 1 further comprises, on the surface of the epitaxial layer 4, a first dielectric region (for example, made of silicon oxide) 12, having a greater thickness at the edge area 4b and a smaller thickness in the active area 4a, where it provides the gate-oxide regions of the elementary electronic components 50. A gate region (made of polysilicon or other conductive material) 14 is provided on the first dielectric region 12; on the gate-oxide regions, the gate region 14 provides the gate structures of the elementary electronic components 50.

In addition, a second dielectric region (for example, made of field oxide) 15 covers the first dielectric region 12 and the gate region 14. The second dielectric region 15 is traversed, at the edge area 4b, by a gate metal contact 18, designed to contact the gate region 14. In addition, the second dielectric region 15, the first dielectric region 12, and the gate region 14 are traversed, in the active area 4a, by a source metal contact 16, extending to contact and short-circuit the source regions 10 and the body wells 9. At the periphery of the edge area 4b (adjacent to the peripheral portion 2a of the die 2), the surface of the epitaxial layer 4 is left exposed so as to enable an equipotential-ring (EQR) metal contact 19 to contact a doped region 20, in particular a doped region having the first type of conductivity (N), provided in the surface portion of the epitaxial layer 4. The doped region 20 is set at a distance from the ring region 5, and has the same ring layout as the latter, surrounding it completely. The contact region 20 has the function of bringing to the surface the drain potential so as to limit horizontally the electric field lines in reverse biasing.

In analyzing the cross sections of FIGS. 2-4, it is to be noted in particular that the cross section of FIG. 2 is taken in a direction transverse to the direction of extension of the charge-balance structures 7, and that the cross sections of FIGS. 2 and 3 are both taken along the direction of extension of the charge-balance structures 7, but on the outside and on the inside, respectively, of a first strip 7a.

It has been shown that power devices of the type described, although having considerable advantages as compared to traditional solutions, may be subject to phenomena of early breakdown that can jeopardize their performance or, in the worst case, prevent their subsequent use (i.e., destroy them).

SUMMARY

An embodiment of the present invention overcomes the above drawbacks and further improves a charge-balance power device.

BRIEF DESCRIPTION OF THE DRAWINGS

For a better understanding of the present disclosure, one or more embodiments are now described, purely by way of non-limiting example and with reference to the attached drawings, wherein.

DETAILED DESCRIPTION

Figure 1:
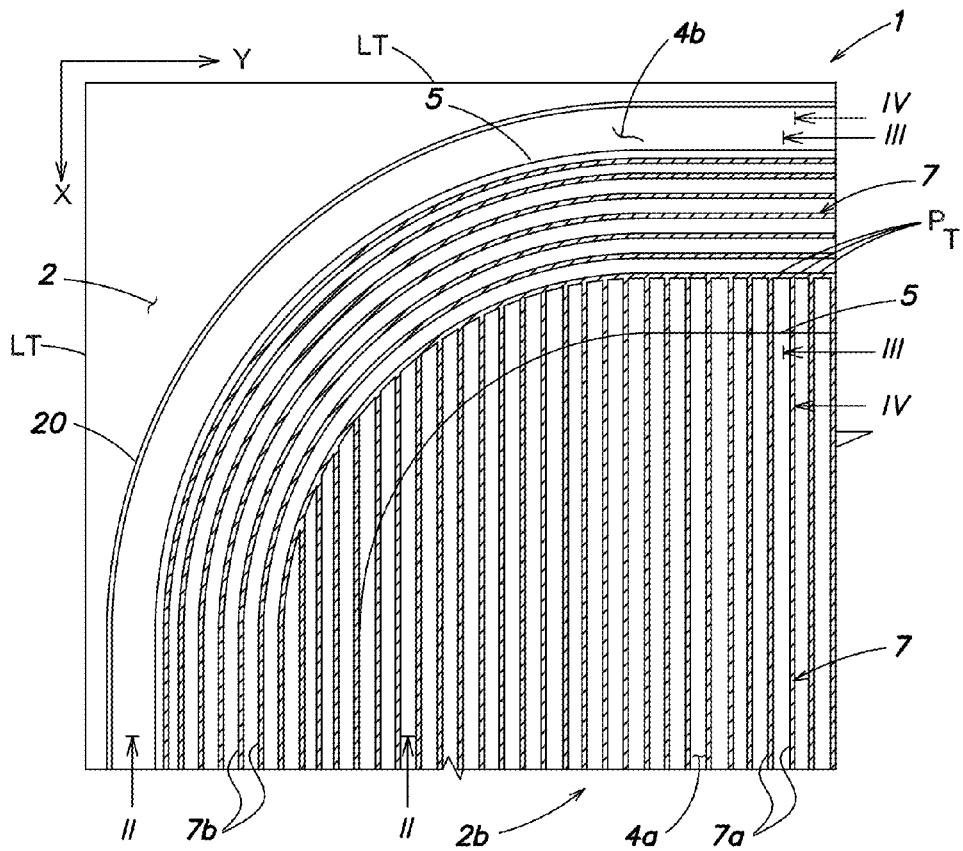
FIG. 1 is a schematic and simplified top plan view of a portion of a power device of a known type, in particular corresponding to an edge-termination structure.

It has been discovered and verified experimentally that the critical features of early breakdown afflicting the multi-drain power devices of the type previously described derive principally from the presence of discontinuities in the charge balance occurring within the edge area 4b, and specifically in the ring region 5.

In particular (see again FIG. 1), these discontinuities occur at the joining points between the charge-balance structures 7 in the active area 4a and those in the edge area 4b, and more particularly in the contact points between the first strips 7a and the second, innermost, strip 7b (i.e., the one closest to the active area 4a), at which the charge may not be balanced and an excess of charge occurs. In detail, two types of intersection zones with marked charge unbalancing are generated: areas that in top plan view can be defined as "cuspidal", designated by $P_C$ in FIG. 1, at the intersection between a first set of first strips 7a and the curved portion of the aforesaid second, innermost, strip 7b; and areas that in top plan view are T-shaped, designated by $P_T$ in FIG. 1, at the intersection between a second set of first strips 7a and the second rectilinear portion of the second, innermost, strip 7b.

Figure 5:
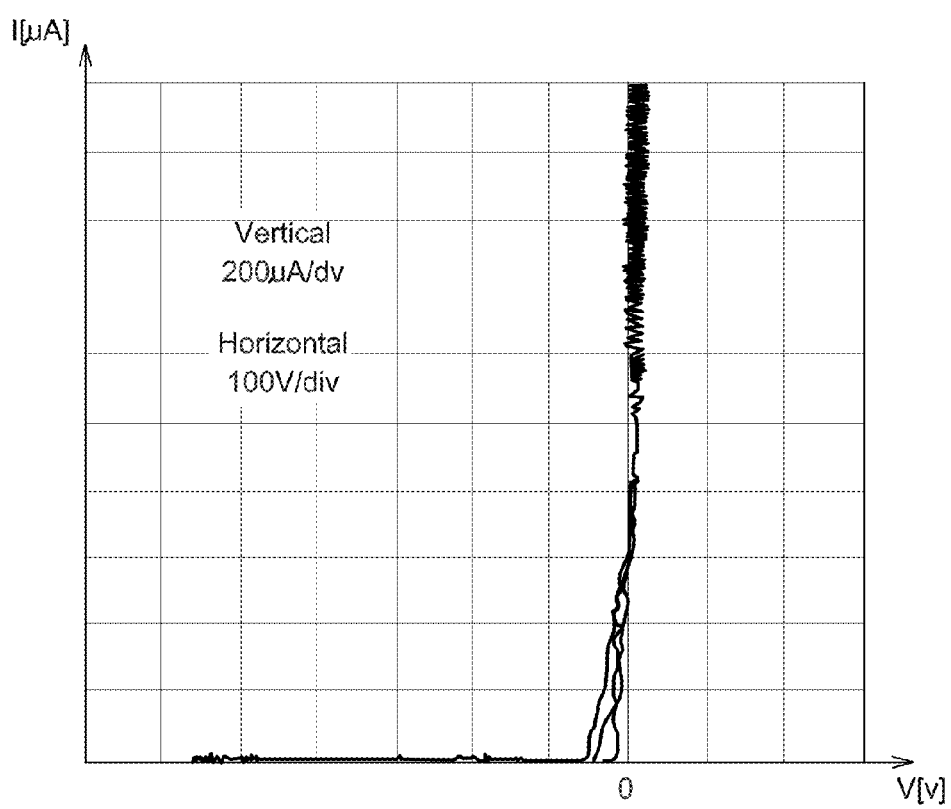
FIG. 5 shows an IN plot representing the reverse breakdown characteristic of the device of FIG. 1.

These areas of excess of charge are a source of early triggering of breakdown having a triangular reverse-biasing characteristic, as shown in FIG. 5, whatever the number of the second strips 7b that are present in the ring region 5.

Figure 6:
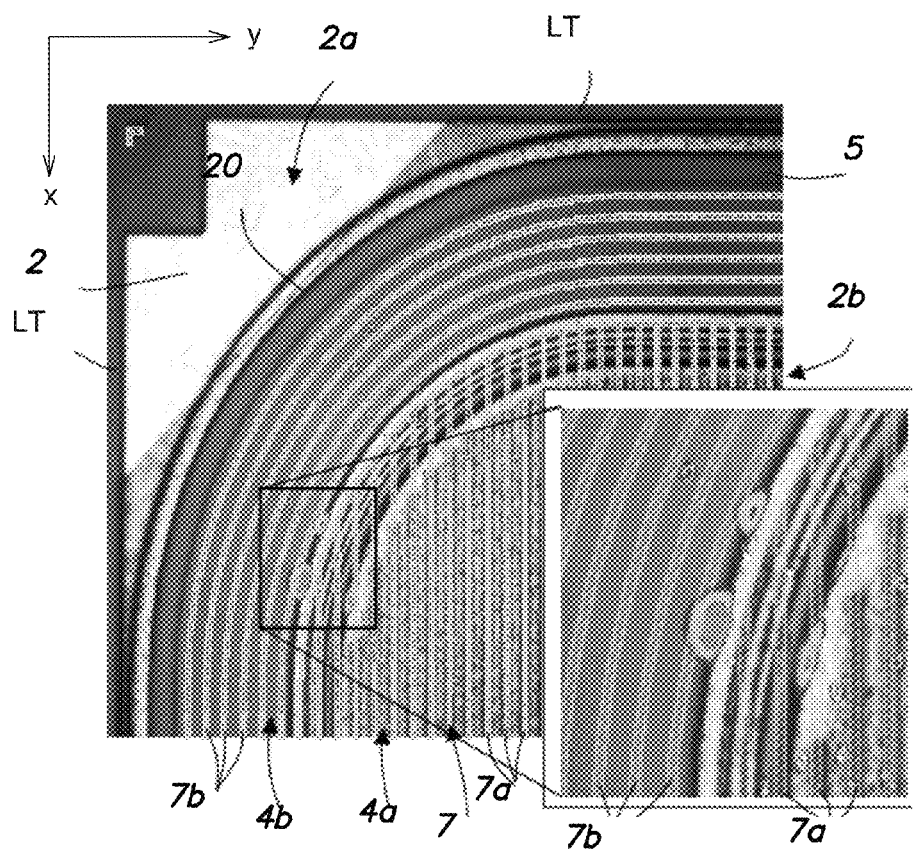
FIG. 6 shows a microscope photograph of the result of an emission-microscopy (EMMI) analysis on the portion of the power device of FIG. 1.

The early triggering phenomena are moreover highlighted by the EMMI analysis shown in FIG. 6, regarding the same portion of device of FIG. 1, in which evident light emission phenomena are visible at the areas with higher charge unbalancing (cuspidal areas $P_C$).

Figure 2:
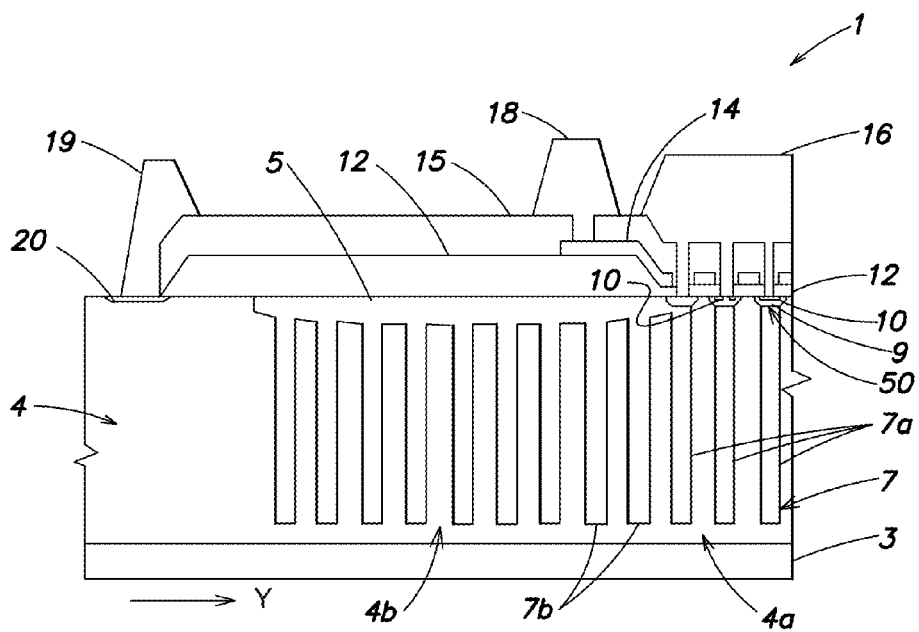
FIGS. 2, 3, and 4 show cross sections of the device of FIG. 1, taken along lines II-II, III-III, and IV-IV of FIG. 1, respectively.
Figure 3:
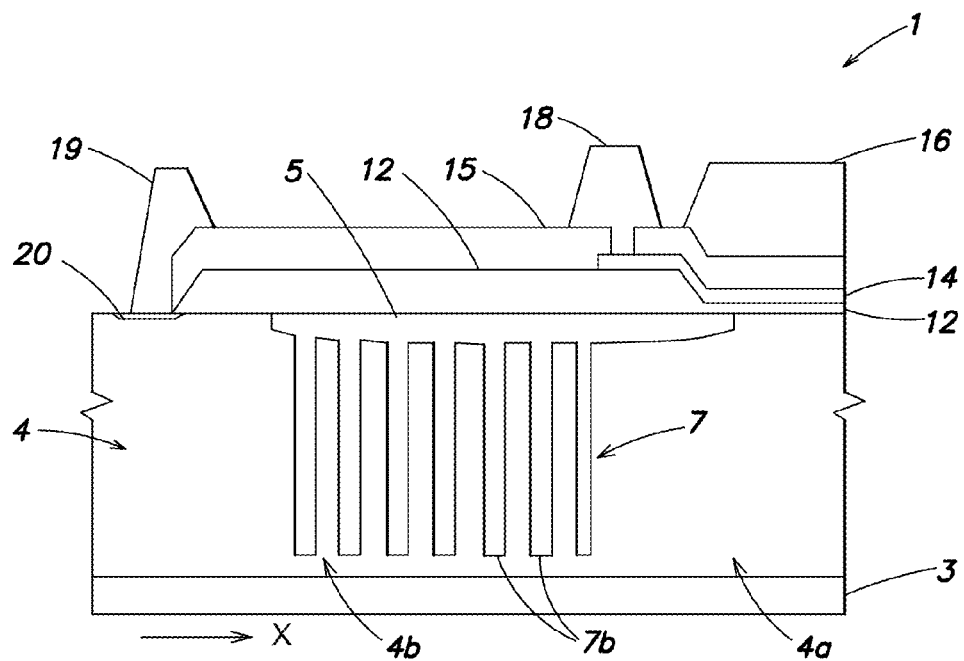
Figure 4:
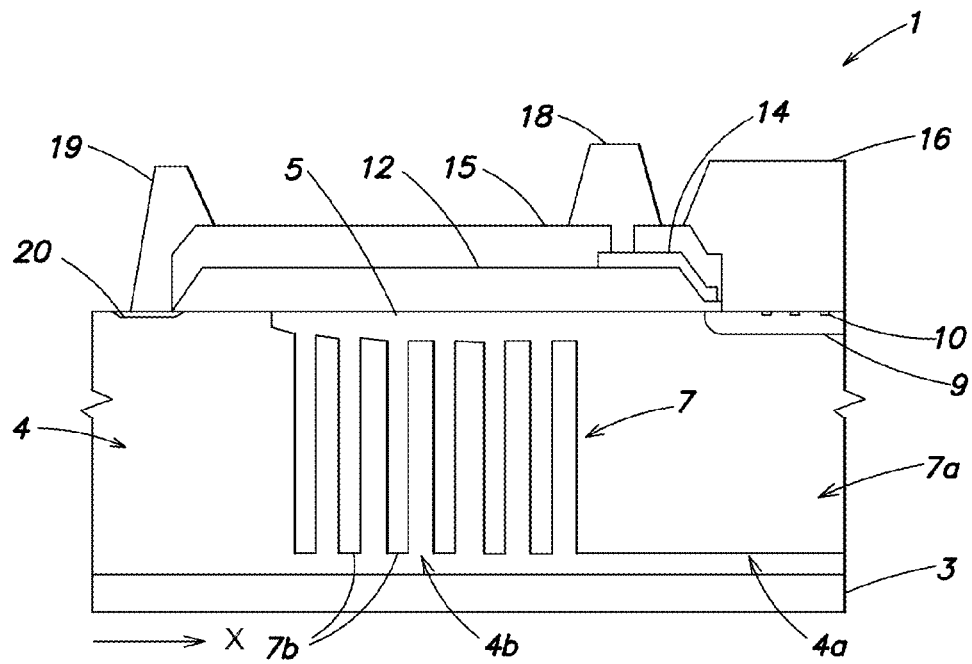

Furthermore, it is noted (reference may be made to the cross sections of FIGS. 2-4) that the sections of the edge area 4b, in a direction orthogonal or parallel to the direction of extension of the first strips 7a, are different from one another, due to the asymmetry introduced in the structure by the arrangement of the second strips 7b in the ring region 5, in particular in terms of the local charge balance that it is possible to obtain and of the number of charge-balance structures 7 joined to the ring region 5.

In order to overcome these critical features, an embodiment of the present invention envisages a different configuration of the charge-balance structures, such that the charge-balance structures occupy substantially uniformly and without any substantial discontinuity the entire area of the power device.

Figure 7A:
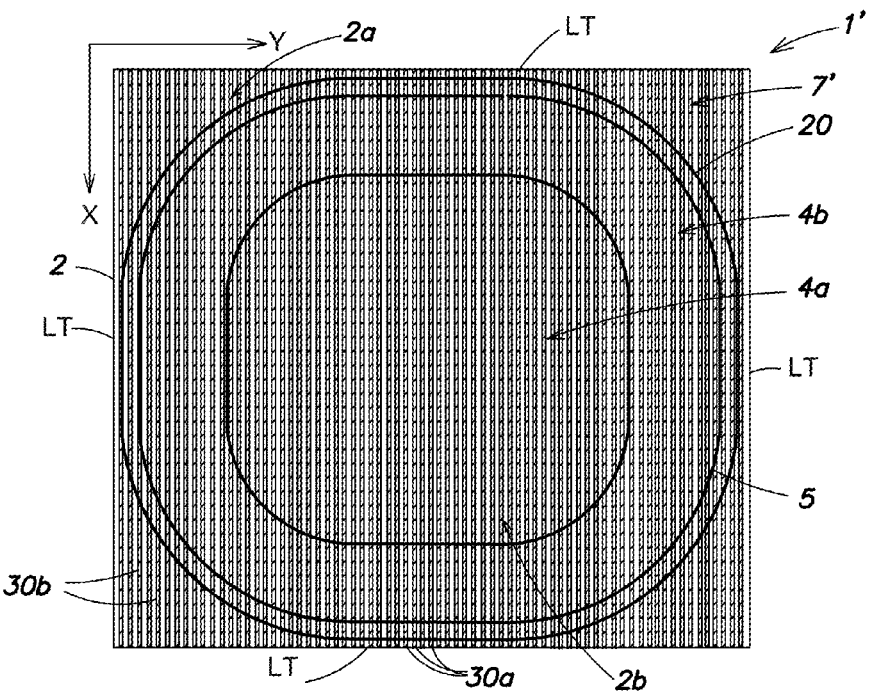
FIG. 7a is a schematic and simplified top plan view of a power device according to an embodiment of the present invention.
Figure 7B:
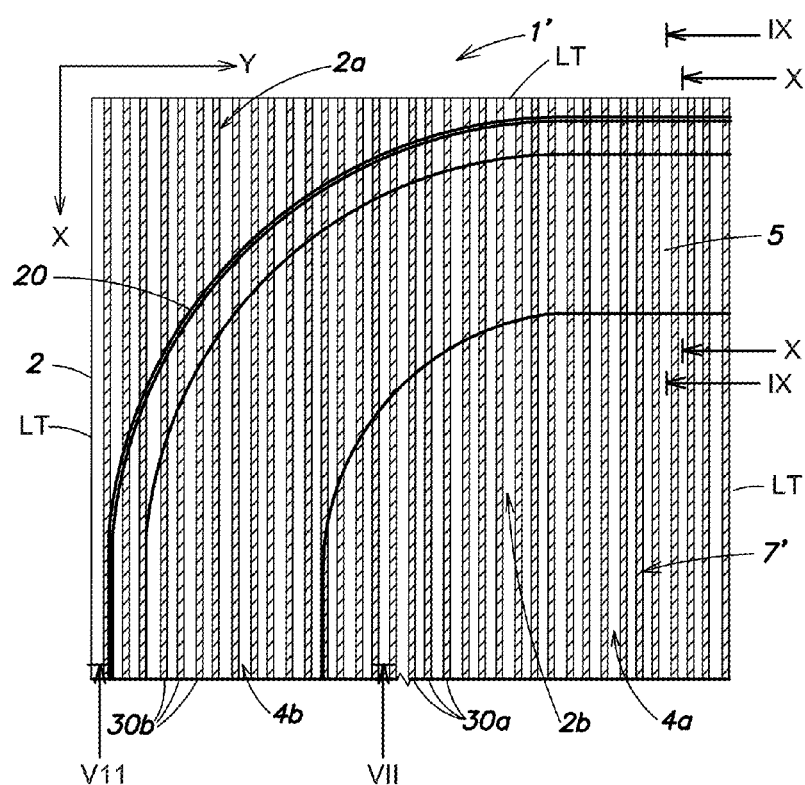
FIG. 7b is a top plan view of a portion of the device of FIG. 7a, in particular regarding an edge-termination structure thereof.

In detail, and as is shown in FIGS. 7a and 7b, where the same reference numbers are used for representing elements similar to others described previously, the charge-balance structures, here designated by 7', of the power device, here designated by 1', comprise strips extending parallel to one another over the entire area of the die 2, and in particular throughout the active area 4a (first strips 30a) and throughout the edge area 4b (second strips 30b), without any mutual intersection. In addition, the strips 30a, 30b extend also to the peripheral portion 2a of the die. The strips 30a, 30b extend, for example, parallel to the first side of the die 2 and to the first axis x, repeating periodically along the second axis y, at a substantially uniform distance of separation. In particular, the charge-balance structures 7' do not follow in this case the layout of the ring region 5. It is to be noted that the first strips 30a extend from the active area 4a into the edge area 4b, and also that the first, outermost, strip 30a (i.e., the one closest to the edge area 4b) is parallel to the adjacent second, innermost, strip 30b (i.e., the one closest to the active area 4a), without intersecting it throughout its extension.

This arrangement makes it possible to avoid discontinuity areas in the charge balance (in particular the cuspidal areas within the ring region 5), that have been shown to be at the origin of the points of local charge unbalancing in the epitaxial layer 4. In particular, the fact that all the charge-balance structures 7' extend in a parallel way means that high electric field is always sustained by parallel "walls" of opposite charge, without intersecting structures that may locally induce an increase in the electric field.

Figure 8:
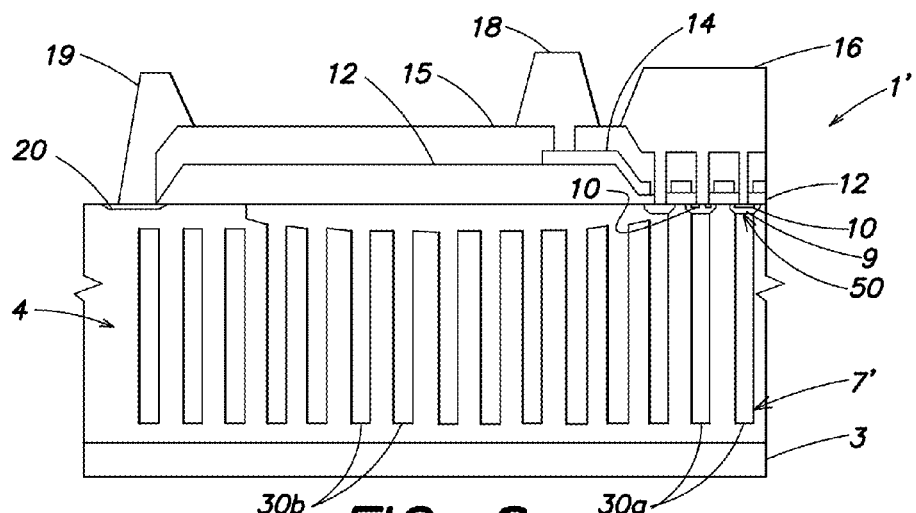
FIGS. 8, 9 and 10 show cross sections of the device of FIGS. 7a and 7b, taken along lines VIII-VIII, IX-IX, and X-X of FIG. 7b, respectively.
Figure 9:
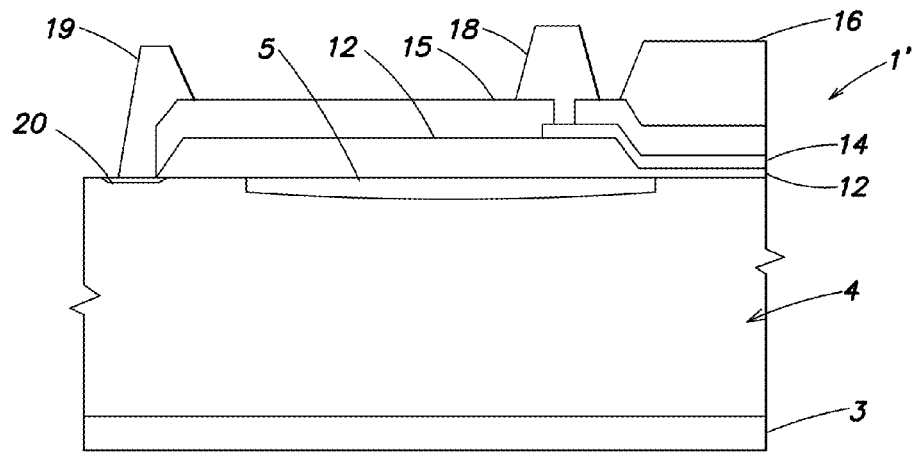
Figure 10:
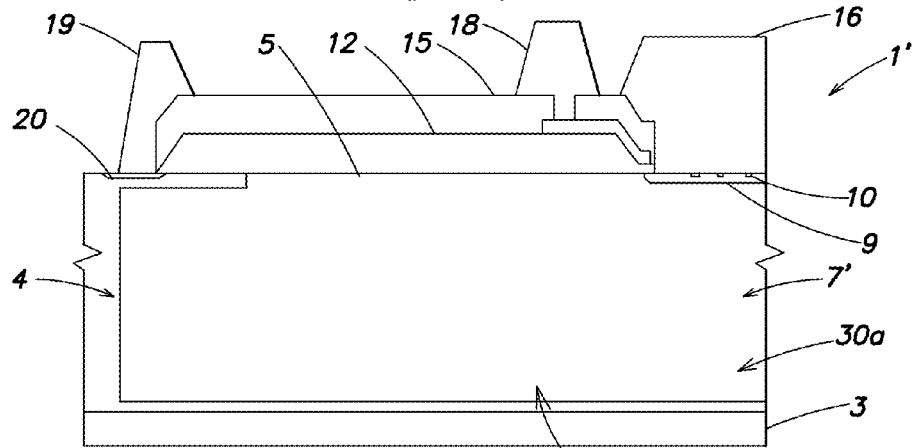

The sections of the edge area 4b, in a direction orthogonal or parallel to the direction of extension of the strips 30a, 30b, as shown in FIGS. 8-10, are in this case clearly equivalent in terms of the local charge balance that it is possible to obtain given that all the strips of the charge-balance structures 7' extend parallel to one another, and in particular demonstrate how charge balance is obtained in the edge area 4b in a way substantially similar to the active area 4a.

Figure 11:
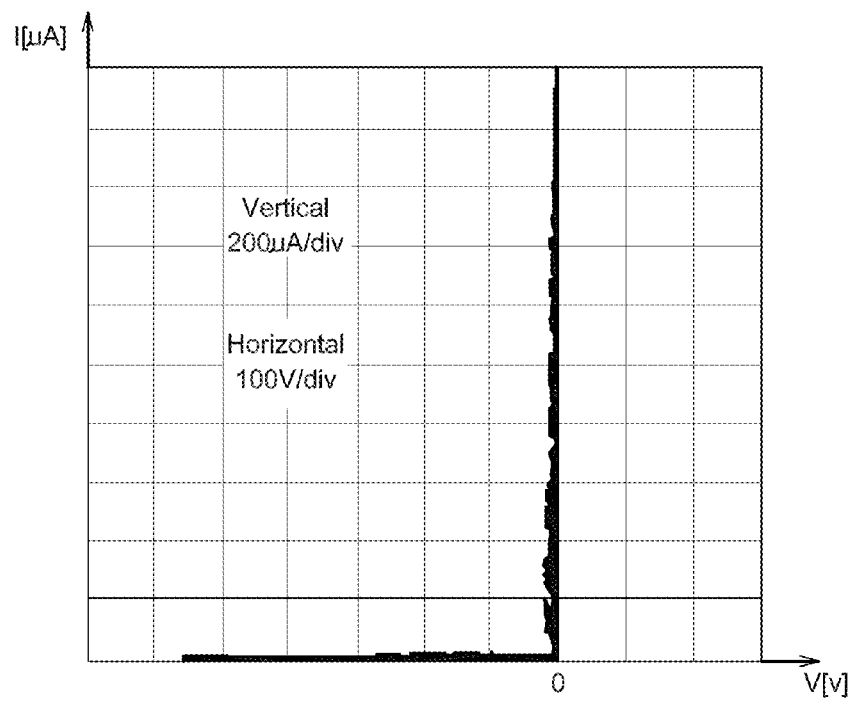
FIGS. 11-12 show plots representing the breakdown characteristics of the device of FIGS. 7a and 7b.
Figure 12:
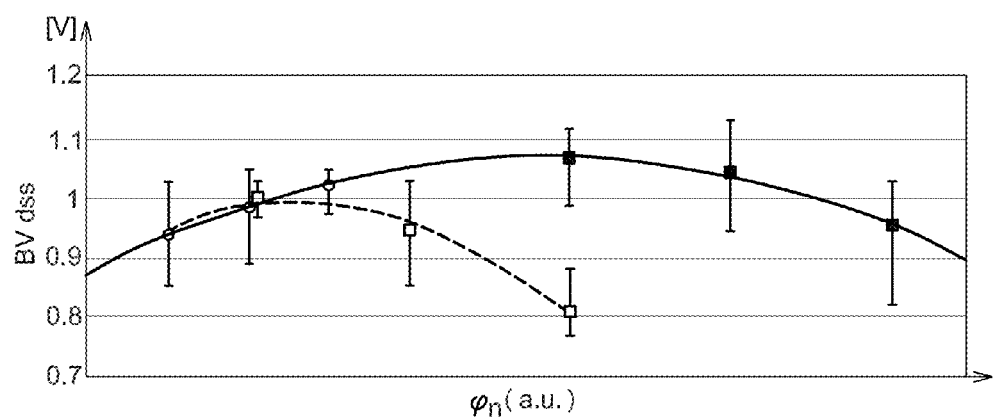

It has been shown experimentally that the structure described, with the consequent elimination of local singularities, makes it possible to inhibit triggering of early breakdown. In this regard, FIG. 11 shows the resulting IN characteristic of the power device 1', whilst FIG. 12 shows the comparison between the evolutions of the normalized breakdown voltage BVdss (breakdown voltage between drain and source with the gate set at ground potential) as a function of the net charge $\Phi_n$ (charge of a P type minus charge of an N type) given in arbitrary units (a.u.), in the power device 1' according to an embodiment of the present invention (solid line) and in a traditional device (dashed line). The shift observed experimentally of the peak of BVdss (that should ideally correspond to the charge balance, $\Phi_n=0$), indicates that the local unbalancing in the structure may induce clamping of the maximum breakdown value.

An optimization of the layout in the edge area 4b may enable elimination of this structural clamping in the breakdown voltage.

Figure 13:
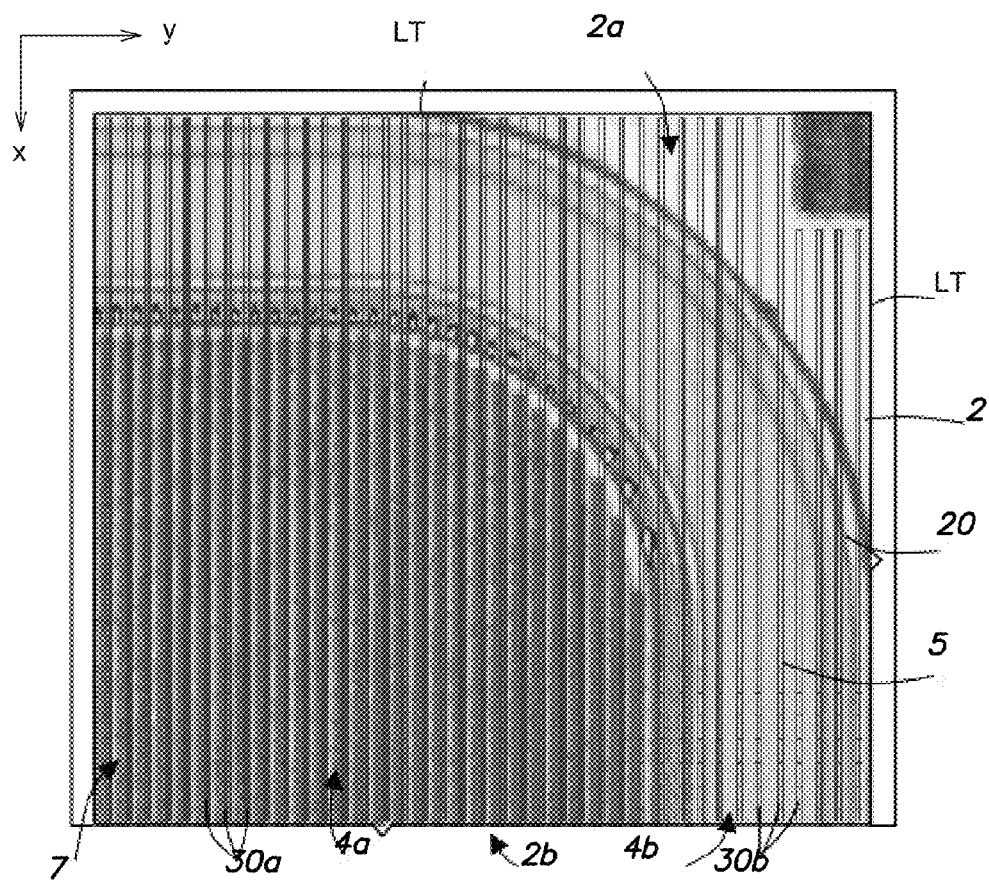
FIG. 13 shows a microscope photograph of the result of an EMMI analysis on the portion of the power device of FIG. 7b.

Also the EMMI analysis in breakdown conditions (FIG. 13) confirms the previous results, highlighting the presence of a substantially uniform emission between the strips of the charge-balance structures 7'.

Figure 14:
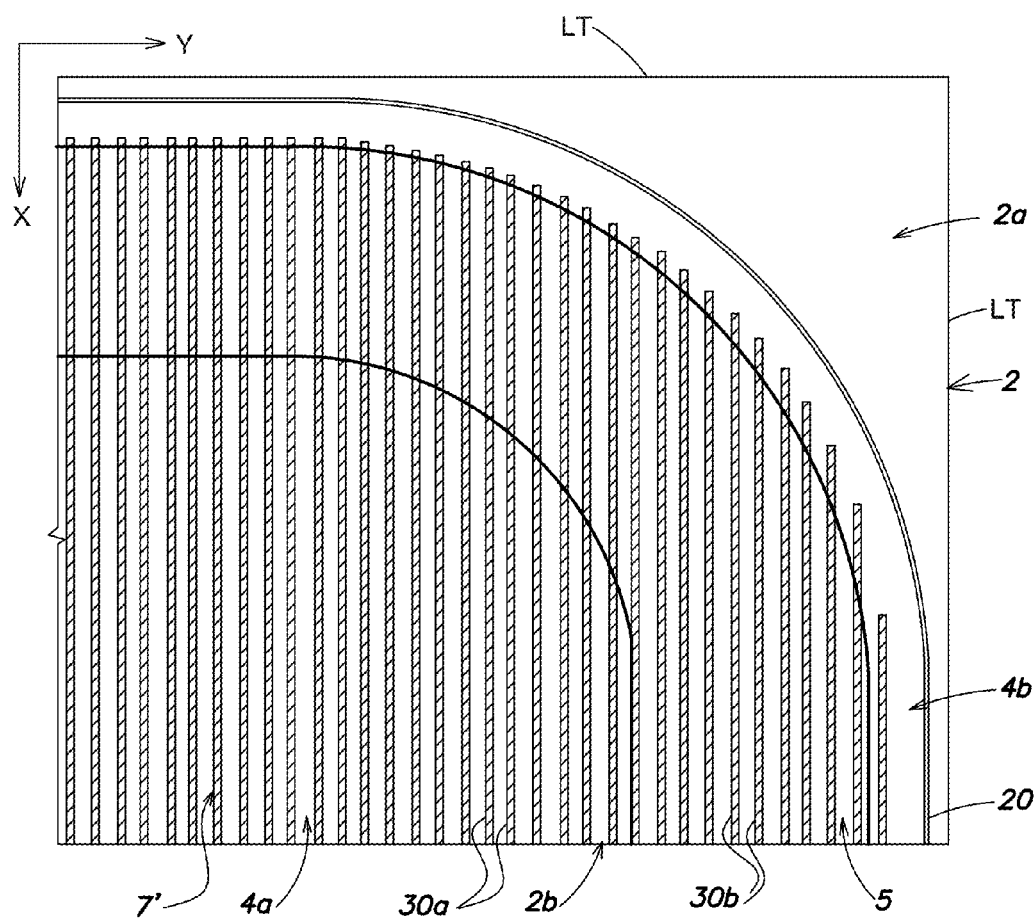
FIGS. 14 and 15 show top plan views similar to that of FIG. 7b, regarding further embodiments of the present invention.

As is shown in FIG. 14, a different embodiment of the present invention envisages that the strips 30a, 30b of the charge-balance structures 7' do not extend throughout the entire surface of the die 2, but stop inside the edge area 4b, before reaching the peripheral portion 2a of the die 2. For example, the strips 30a, 30b interrupt beyond the ring region 5, in an intermediate point between the ring region 5 itself and the EQR metal contact 19 and the corresponding doped region 20. In particular, beyond the intermediate point there is no presence either of prolongations of the first strips 30a or prolongations of the second strips 30b, or of the same second strips 30b.

Figure 15:
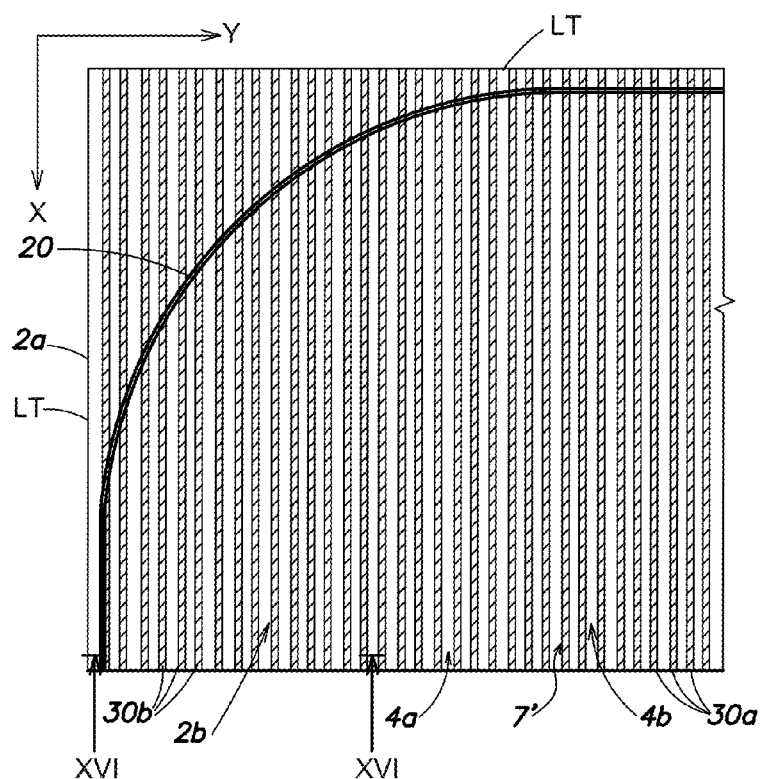
Figure 16:
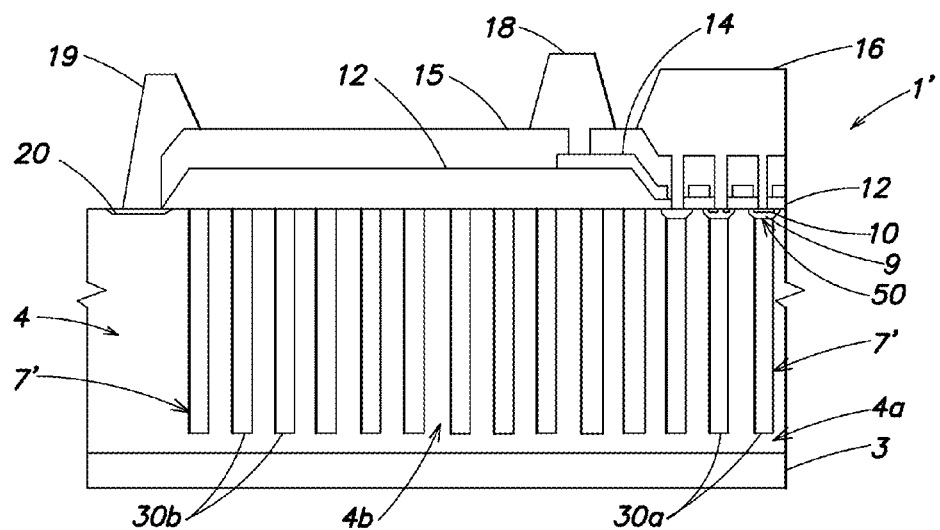
FIG. 16 shows a cross section of the power device shown in FIG. 15, taken along the line XVI-XVI.

A further embodiment of the present invention, shown in FIG. 15 (in top plan view) and in FIG. 16 (in a section transverse to the direction of extension of the strips 30a, 30b), further envisages the possibility that the edge-termination structure of the power device 1' does not comprise the ring region 5 in the edge area 4b. In the example shown, the strips 30a, 30b extend again parallel to one another and in a uniform way, over the entire area of the die 2, in the active area 4a and in the edge area 4b of the epitaxial layer 4. This embodiment may solve the problem of "charge unbalancing" induced by the ring region 5, in the cases where it is possible to verify that the accumulation of charges due to the presence of points with high electric field (which are no longer eliminated by the ring region) does not lead to a significant decrease in reliability. In fact, the ring region 5 introduces a surface charge at the edge area 4b, which adds (with its sign) to the charge present in the charge-balance structures, consequently introducing in the proximity of the surface a certain local lack of uniformity in the charge balance.

Advantages of the semiconductor power device and of the corresponding edge-termination provided according to one or more embodiments of the present invention are clear from the foregoing description.

In particular, an embodiment removes, in multi-drain power devices basing their operation on charge balance in the epitaxial layer operating as extension of the drain, any discontinuity in the charge balance and consequently early breakdown phenomena, rendering the breakdown characteristic hard. The periodic and uniform structure of the charge-balance structures is maintained also in the edge region of the power device, providing a substantial charge balance in the drain region not only in the active area but also at the edge, and preventing the edge-termination structure from introducing significant singularities and significant local excesses of charge. In particular, the improvement of the performance in reverse biasing enables improvement of the industrialization of the process and the quality and reliability of the final devices produced.

Thanks to charge balancing, it is also possible to obtain values of resistivity of the epitaxial layer lower than 2 Ω·cm, and values of inhibition voltage comprised between 100 and 1500 V, as the thickness of the epitaxial layer varies.

Finally, it is clear that modifications and variations may be made to what is described and illustrated herein, without thereby departing from the scope of the present disclosure.

Figure 17:
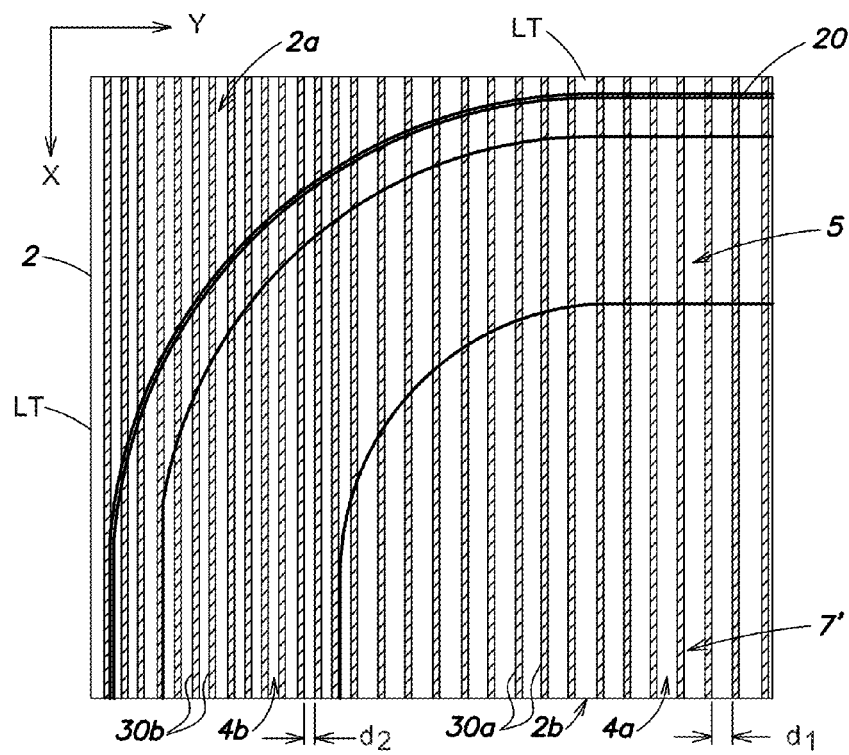
FIGS. 17 and 18 show top plan views similar to that of FIG. 7b, regarding further variant embodiments of the present invention.

In particular, as is shown in FIG. 17 in an embodiment, a first spacing $d_1$ may be provided in the active area 4*a* between the first strips 30*a*, and a second spacing $d_2$, different from the first, between the second strips 30*b* in the edge area 4*b*. In the example shown, the distance between the first strips 30*a* is greater than the distance between the second strips 30*b* (but also the opposite solution may be adopted, $d_2 > d_1$).

Figure 18:
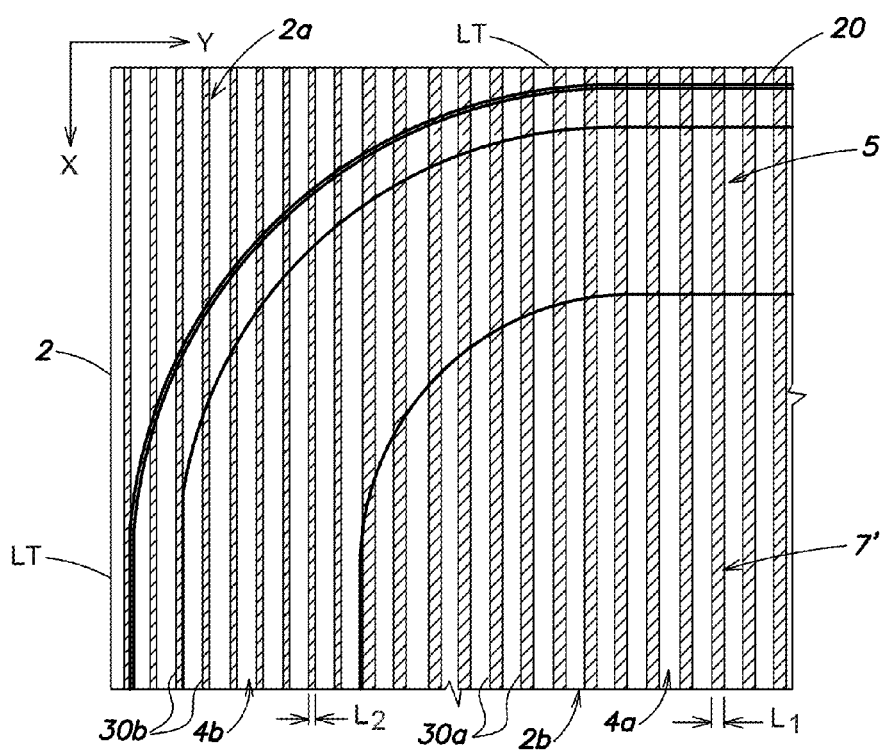

As is shown in FIG. 18, in an embodiment the strips 30*a*, 30*b* may have a different size (in particular, a different width L in a direction transverse to their main direction of extension) in the active area 4*a* with respect to the edge area 4*b*. For example, the first strips 30*a* may have a transverse dimension $L_1$, and the second strips 30*b* a second transverse dimension $L_2$, smaller than the first one (once again, the opposite solution may be alternatively adopted, $L_2 > L_1$).

In particular, the aforesaid alternative embodiments may make it possible to afford greater margins of freedom in redefining the "design rules" in order to offset the charge unbalancing induced by the ring region 5 (in the case where it is not possible or desirable to eliminate it in order not to risk reliability problems), optimizing the size and spacing of the strips of the charge-balance structures in the edge area 4*b*.

Furthermore, in an embodiment, the charge-balance structures 7', instead of extending only within the epitaxial layer 4, may also reach the substrate 3 and terminate within the same substrate 3.

Clearly, different techniques may be used for obtaining the charge-balance columnar structures. For example, as described in patent application No. WO 2007/006503, which is incorporated by reference, the successive steps of epitaxial growth and implantation for creating superimposed implanted regions, instead of being designed to form the columnar structures, may be designed to form regions which are to define, between one another, the charge-balance columnar structures. Alternatively, as described in patent application No. EP-A1-1911075, which is incorporated by reference, it is possible to envisage successive superimposed implantations (in corresponding regions of epitaxial growth) to provide both the charge-balance columnar structures and the regions of opposite conductivity set between the same columnar structures. Alternatively, it may be possible to use the non-selective technique of epitaxial growth within trenches, substantially as described in the aforesaid patent applications Nos. WO 2007/116420 and WO 2007/122646, which are incorporated by reference.

One or more of the embodiments described may also be used, with the appropriate small modifications, to obtain a generic charge-balance power device (for example, a bipolar diode, a Schottky diode, a BJT, an IGBT, etc.) and the corresponding edge-termination structure. In particular, it is clear that, in the case, for example, of a diode power device, the epitaxial region constitutes an extension of a cathode terminal (even though usually also this power device is identified by the term "multi-drain"). Furthermore, it is evident that it is possible to obtain dual structures in which the charge balance is provided by means of formation of columnar structures with N doping in an epitaxial layer with P doping.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method, comprising:
    forming an active region in a layer of a first conductivity type adjacent to a corner region of the layer;
    forming an equipotential ring of the first conductivity type surrounding the active region and extending through the corner region;
    forming a plurality of charge balancing structures of a second conductivity type extending across the active region and into the corner region, wherein the charge balancing structures terminate a substantially uniform distance from the equipotential ring and do not intersect another charge balancing structure; and
    forming a lightly doped semiconductor region of the second conductivity type at a surface of the layer that extends from the active region and terminates a substantially uniform distance from the equipotential ring, wherein the ends of the charge balancing structures extend beyond the lightly doped semiconductor region.

2. The method of claim 1, wherein:
    the first conductivity type comprises N type; and the second conductivity type comprises P type.

3. The method of claim 1, further comprising forming in the corner region of the layer at least two substantially parallel first columns having the second conductivity type and substantially a same length.

4. The method of claim 1, further comprising forming in the corner region of the layer at least two substantially parallel first columns having the second conductivity type and different lengths.

5. The method of claim 1, further comprising growing the layer epitaxially over a substrate.

6. The method of claim 1, wherein the charge balancing structures terminate between the lightly doped semiconductor region and the equipotential ring.

7. The method of claim 1, further comprising:
    forming in the corner region at least two substantially parallel first columns having the second conductivity type and each substantially having a first width;
    forming in the active region at least two second columns having the second conductivity type, substantially parallel to the at least two first columns, and each substantially having a second width that is different from the first width.

8. The method of claim 1, further comprising:
  forming in the corner region at least two substantially parallel first columns having the second conductivity type and each separated from an adjacent first column by substantially a first distance; and
  forming in the active region at least two second columns having the second conductivity type, substantially parallel to the at least two first columns, and each separated from an adjacent second column by substantially a second distance that is different from the first distance.

9. The method of claim 1, further comprising forming the lightly doped semiconductor region as a continuous ring around the active region.

10. The method of claim 1, further comprising forming the lightly doped semiconductor region to have a bulged lower boundary.

11. The method of claim 1, further comprising forming the lightly doped semiconductor region to connect a plurality of charge balancing structures outside the active region.

12. The method of claim 1, further comprising forming in the corner region adjacent to a surface of the layer a bias region having the first conductivity type at least partially around the active region.

13. The method of claim 1, wherein forming the plurality of charge balancing structures comprises:
  forming substantially straight trenches in the layer; and
  forming in the trenches a material having the second conductivity type.

14. The method of claim 1, wherein forming the plurality of charge balancing structures comprises:
  forming substantially straight trenches in a first portion of the layer;
  forming in the trenches a material having the second conductivity type; and
  forming a second portion of the layer over the trench.

15. The method of claim 1, further comprising forming gate structures in the active region for at least two transistors adjacent surface regions of three charge balancing structures.

16. The method of claim 15, further comprising forming source regions for two transistors over at least one of the three charge balancing structures.

17. The method of claim 1, further comprising forming the lightly doped semiconductor region to have a dopant concentration less than $10^{16}$ at/cm$^3$.

18. The method of claim 1, further comprising forming the plurality of charge balancing structures to extend through the layer and into an adjacent material.

19. A method, comprising:
  forming an active region of a power device in a layer of a first conductivity type adjacent to a corner region of the power device;
  forming across the active region and in the corner region plural non-intersecting charge balancing structures having a second conductivity type and being substantially straight; and
  forming a contact ring of the first conductivity type surrounding the active region and running through the corner region, wherein a first width of, or a first spacing between, charge balancing structures in the active area is different than a second width of, or second spacing between, charge balancing structures outside the active area.

20. The method of claim 19, further comprising forming the plural charge balancing structures to be substantially parallel.

21. The method of claim 19, further comprising forming the plural charge balancing structures to have P type conductivity.

22. The method of claim 19, further comprising forming the plural charge balancing structures to have N type conductivity.

23. The method of claim 19, wherein the plural charge balancing structures terminate at approximately a uniform distance from the contact ring.

24. The method of claim 19, further comprising
  forming gate structures for at least two transistors adjacent surface regions of three charge balancing structures in the active region.

25. The method of claim 24, further comprising
  forming source regions for two transistors over at least one of the three charge balancing structures.

26. The method of claim 24, further comprising forming body wells at the surface regions of the three charge balancing structures.

27. The method of claim 26, further comprising:
  forming source regions for two transistors in at least one of the body wells; and
  forming a source contact to the source regions and the at least one body well.

28. The method of claim 19, further comprising forming the plural charge balancing structures to extend through the layer and into an adjacent material.

* * * * *